United States Patent

Elias et al.

[15] 3,686,665

[45] Aug. 22, 1972

[54] DIGITAL FUNCTION GENERATOR

[72] Inventors: Laurence F. Elias, Penllyn; James H. Magee, Southampton, both of Pa.

[73] Assignee: Leeds & Northrup Company, North Wales, Pa.

[22] Filed: Dec. 31, 1969

[21] Appl. No.: 889,506

[52] U.S. Cl. ..340/347 AD, 340/347 NT, 235/92 PL, 235/92 CC

[51] Int. Cl. ..........................................H03k 13/16

[58] Field of Search..340/347 AD, 347 NT; 235/154, 235/92 PL

[56] References Cited

UNITED STATES PATENTS

| | | | |
|---|---|---|---|
| 3,512,151 | 5/1970 | Finkel | 340/347 AD |
| 3,458,809 | 7/1969 | Dorey | 340/347 NT |
| 3,462,758 | 8/1969 | Reynal | 340/347 NT |
| 3,058,657 | 10/1962 | Tripp | 235/154 |
| 3,445,840 | 5/1969 | Carlstead | 235/92 PL |
| 3,349,390 | 10/1967 | Glassman | 235/92 PL |

*Primary Examiner*—Maynard R. Wilbur
*Assistant Examiner*—Robert F. Gnuse
*Attorney*—Woodcock, Washburn, Kurtz and Mackiewicz

[57] ABSTRACT

A method and apparatus for converting substantially instantaneous values of a variable analog input to substantially instantaneous values of a variable digital output which is a nonlinear function of the variable analog input. A particular linear segment approximating that portion of a nonlinear function on which a particular instantaneous value of the analog input is located is identified by accumulating a corresponding digital count in a register in response to gated clock pulses during a first digitized cycle and the register is then cleared. Stored count modifiers corresponding to the slope and intercept of the identified linear segment are entered into the register and a count is accumulated in the register in response to gated clock pulses generated during a second digitizing cycle, the accumulated count being the substantially instantaneous value of the digital output representing desired engineering units.

18 Claims, 10 Drawing Figures

Patented Aug. 22, 1972

3,686,665

7 Sheets-Sheet 5

DIGITAL FUNCTION GENERATOR

BACKGROUND OF THE INVENTION

1. Field of the Invention

This invention relates to converting analog or digital values of an input to digital values of an output where the output is a known function of the input.

This invention also relates to converting analog or digital values of the input function to digital values of an output function where the output function has a known relationship to the input function including the case where one of the functions is linear.

2. The Prior Art

Heretofore, it has been recognized that an analog input may be converted to a digital output even though the output is a nonlinear function of the input. This conversion has been achieved by the approximation of the function as a plurality of straight-line segments joining breakpoints on the function, the segments having different slopes and intercepts. The digital output has then been generated as a linear function of the analog input, the function having a particular slope and intercept corresponding to a particular straight-line segment such that an instantaneous value of the digital output and corresponding instantaneous value of the analog input are approximated by a point on a particular straight-line segment.

As disclosed in U.S. Pat. No. 3,354,452 - Bard et al., assigned to the assignee of this invention, a digital output which is a nonlinear function of an analog input is obtained by a linearized analog-to-digital converter. In order to obtain the digital output as a linear function of the input while the input signal is still in the analog state, the gain and offset of an amplifier are adjusted to obtain a slope and intercept characteristic of a linear segment of the function in the vicinity of a particular analog input under consideration. Thus the converter analogically modifies the digital output by amplifier gain and offset changes corresponding to the proper slope and intercepts once the proper linear segment is identified. In other prior art, the particular linear segment associated with a particular analog input has been identified analogically; i.e., a particular frequency is generated by the input to identify the linear segment.

However, there is absent from the prior art means for digitally identifying the linear segment associated with a particular analog input and digitally modifying the digital output in response to the identified segment.

SUMMARY OF THE INVENTION

It is a general object of this invention to obtain a digital output as a function of an analog or digital input by digitally modifying the output after digitally identifying the input and a segment of the function.

It is a more specific object of this invention to obtain a digital output in the form of a final digital count representing desired engineering units which is a function of an analog or digital input by digitally modifying the final count with one or more count modifiers after identifying the input and a segment of the function by an initial count.

In accordance with these and other objects, the invention embraces a method of an apparatus for producing a digital output obtained as a function of an analog or digital input after an identification cycle and a readout cycle. During the identification cycle, an initial digital count accumulates in a register which identifies the instantaneous value of the input, identifies a particular segment of the function on which the instantaneous value of the input is located, and identifies one or more count modifiers corresponding to that particular identified segment of the function. The register is then cleared. During a digital readout cycle, a digital count accumulates in the register which is modified by one or more count modifiers to equal the instantaneous value of the digital output.

Embodiments of the invention may be utilized to obtain a digital output which is a nonlinear function of an analog input. In one embodiment, a dual slope ADC (analog-to-digital converter), characterized by a digitizing cycle having a sampling period and a measuring period, is combined with a register. Throughout a first digitizing cycle which is the identification cycle, the ADC, in response to the input, generates clock pulses which are counted in the register. The count accumulated in the register at the end of the measuring period of the first digitizing cycle identifies the instantaneous value of the input, a linear segment approximating or duplicating that portion of the nonlinear function on which the instantaneous value of the input lies, and count modifiers corresponding to the slope and intercept of the identified linear segment. Throughout a second digitizing cycle which is the readout cycle, the ADC, in response to the input, generates clock pulses which are again counted in the register. Before, during, or after the sampling period and before the measuring period, the slope count modifier is entered in the register. Before, during, or after the measuring period and after the slope count modifier has been entered in the register, the intercept count modifier is entered in the register such that the final accumulated count is substantially the instantaneous value of the digital output in desired engineering units corresponding to the instantaneous value of the analog input.

In another embodiment, a digital or pulse frequency modulated transducer characterized by a digitizing cycle having a single counting period and an additional register are combined with a main register. Throughout a first digitizing cycle which is again the identification cycle, the digital transducer, in response to the input, generates pulses which are counted in the main register. The count accumulated in the main register at the end of the counting period of the first digitizing cycle, as determined by a predetermined count of pulses accumulated in the additional register, identifies the instantaneous value of the input, a linear segment approximating or duplicating that portion of the nonlinear function on which the instantaneous value of the input lies, and count modifiers corresponding to the slope and intercept of the identified linear segment. Throughout a second digitizing cycle which is the readout cycle, the digital transducer generates pulses which are again counted in the main register during the counting period of the second digitizing cycle, as again determined by a predetermined count of pulses accumulated in the additional register. Before or during the counting period of the second digitizing cycle, the slope count modifier is entered in the additional register and the intercept count modifier is entered in the main register such that the final count is substantially the instantaneous value of the digital output in desired engineering units corresponding to the instantaneous value of the analog input.

BRIEF DESCRIPTION OF THE DRAWINGS

For a more complete understanding of the invention and further objects and advantages thereof, reference is made to the following description taken in conjunction with the accompanying drawings in which.

DESCRIPTION OF THE INVENTION

For ease in understanding the present invention, the underlying theory will be presented in terms of a specific application to a thermocouple as an exemplary type of nonlinear transducer. Accordingly, reference is now made to FIGS. 1 and 2 wherein a nonlinear temperature-voltage function characteristic of a thermocouple is disclosed.

Figure 1:
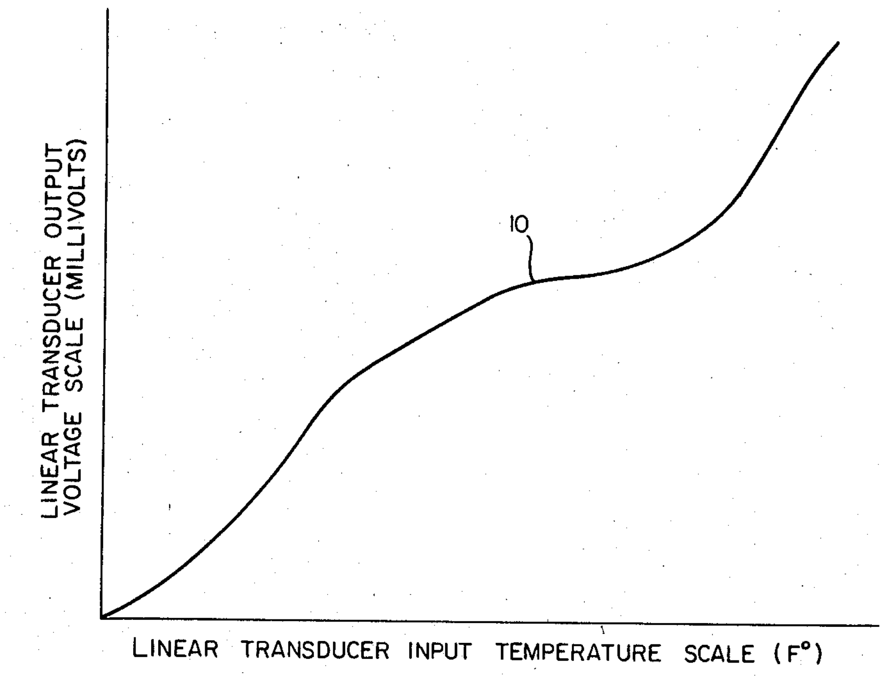
FIG. 1 is a plot of a nonlinear temperature-voltage function characteristic of a thermocouple with temperature, the independent input variable, plotted as abscissae and voltage, the dependent output variable, plotted as ordinates.

In FIG. 1, a curve 10 represents the conventional thermocouple temperature-millivolt function with the thermocouple transducer input, temperature which is the independent variable in terms of degrees Fahrenheit, plotted on a linear scale as abscissae and the thermocouple transducer output voltage which is the dependent variable in terms of millivolts plotted on a linear scale as ordinates. As may be readily seen, the temperature-voltage function of the thermocouple is indeed nonlinear.

Figure 2:
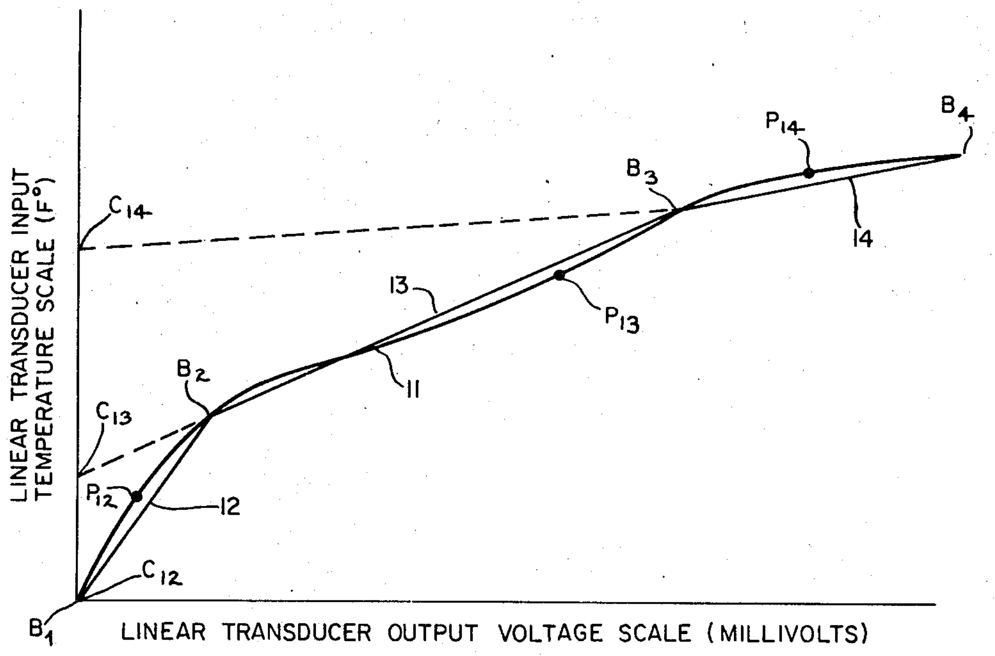
FIG. 2 is a plot of the nonlinear temperature-voltage function of FIG. 1 except that the transducer output or voltage is plotted as abscissae and the transducer input or temperature is plotted as ordinates with various straight-line segments extending between breakpoints on the function illustrated as an approximation of the function.

The same nonlinear relationship between temperature and voltage may be seen in a voltage-temperature curve 11 of FIG. 2 which may be thought of as the characteristic of a system where the thermocouple output voltage is now plotted as the system input on a linear abscissa scale and the temperature, which produces the thermocouple output voltage, is plotted as the system output on a linear ordinate scale. Thus by coupling the thermocouple output voltage to the system to be described hereinafter as the input to that system, a digital output may be obtained from the system corresponding to the temperature generating the particular voltage response of the thermocouple even though the temperature is nonlinearly related to the voltage.

Where the mode of operation of the system to be described is basically linear and the voltage-temperature function in the form of curve 11 is nonlinear, it will be understood that the curve 11 cannot represent the linear characteristic of the system. However, the nonlinear voltage-temperature function in the form of curve 11 which corresponds exactly to the nonlinear temperature-voltage function of the thermocouple may be linearized or approximated within acceptable error limits by a plurality of linear functions. More particularly, the curve 11 may be approximated by a linear segment 12 between breakpoints $B_1$ and $B_2$ of the curve 11, a linear segment 13 between breakpoints $B_2$ and $B_3$ of the curve 11, and a linear segment 14 between breakpoints $B_3$ and $B_4$ of the curve 11. Each of the segments 12, 13 and 14 have characteristic slopes $M_{12}$, $M_{13}$ and $M_{14}$ and intercepts $C_{12}$, $C_{13}$ and $C_{14}$ respectively on the linear temperature scale.

It should now be understood that any point on the curve 11 may be represented as a linear function in terms of voltage and temperature with a slope equal to the slope of a particular segment and an intercept equal to the intercept temperature of the particular segment extended to the abscissa. Thus for a point on the segment 12 such as point $P_{12}$, the output representing the thermocouple input temperature, as a function of the input, the thermocouple output voltage, may be expressed as $$T_{out} = M_{12} V_{in} + C_{12}. \quad (1)$$

Similarly, for points $P_{13}$ and $P_{14}$ $$T_{out} = M_{13} V_{in} + C_{13} \quad (2)$$

$$T_{out} = M_{14} V_{in} + C_{14} \text{ respectively.} \quad (3)$$

The equation may be rewritten in the following form to reflect an analog-to-digital conversion characteristic of an ADC volt-count converter producing a count $N_{Tout}$ representing input temperature of the thermocouple in desired engineering units, degrees C. or F.:

$$N_{Tout} = (V_{in}/V_{ref}) \times N_{12} + C_{12} \quad (4)$$

$$N_{Tout} = (V_{in}/V_{ref}) \times N_{13} + C_{13} \quad (5)$$

$$N_{Tout} = (V_{in}/V_{ref}) \times N_{14} + C_{14} \quad (6)$$

where $V_{ref}$ = a reference voltage of the ADC converter, $N_{12}$, $N_{13}$, and $N_{14}$ = counts corresponding to the slopes of the linear segments 12, 13 and 14, and $C_{12}$, $C_{13}$, and $C_{14}$ = counts corresponding to intercepts of the linear segments extended.

Figure 3:
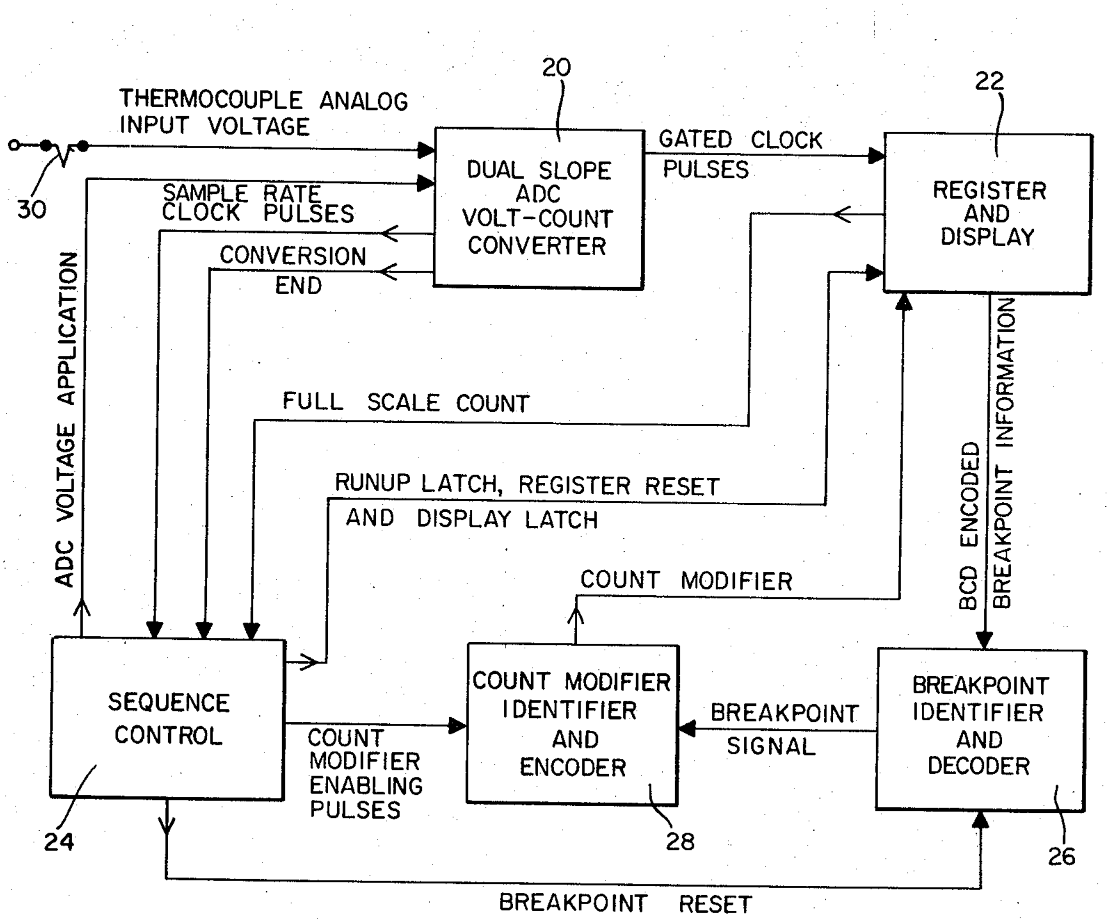
FIG. 3 is a block diagram illustrating a system embodying one form of the invention.

Relying on the foregoing equations, and FIG. 2, it will now be shown by reference to FIG. 3 that an instantaneous value of output representing temperature which is nonlinearly related to an instantaneous value of an analog input voltage may be obtained from a system operating in a basically linear mode if the proper approximating linear segments of the voltage-temperature function are established, the particular segment corresponding with a particular analog input voltage is digitally identified, and a digital count is accumulated which is modified by appropriate slope count modifiers and appropriate intercept count modifiers.

Referring now to FIG. 3, the analog input voltage from the thermocouple 30 is applied to the system including a conventional ADC 20 (analog-to-digital converter) of the dual slope volt-count type such as the AN 2317 manufactured by the Analogic Company which has been shown in elementary form in conjunction with the sequence control 24. Characteristically, the conventional dual slope ADC has a digitizing cycle including a sampling period in which $V_{in}$ is applied to the input of the ADC and a measuring period in which a reference voltage $V_{ref}$ of opposite polarity is applied to the ADC. In the context of FIG. 3, an output voltage $V_{in}$ from the thermocouple 30 is applied to the ADC 20 in response to a signal from the sequence control 24 which is under the control of clock pulses from the ADC 20. The ADC than produces a series of gated clock pulses applied to a register 22 having a count and display capacity of 10,000 counts. After the full-scale count has accumulated in the register 22, a second counting period coinciding with a measuring period begins and a signal indicative of the full-scale count is applied to the sequence control 24 and initiates the application of the reference voltage $V_{ref}$ to the ADC 20. At the end of the measuring period, the accumulated count in the register 22 is proportional to the input voltage $V_{in}$. However, since the temperature and voltage of the curve 11 are related nonlinearly, a mere proportional count accumulating in the register 22 at the end of the first digitizing cycle will not indicate the temperature which corresponds to a voltage for any point on the curve 11. But, by approximating the curve 11 by the straight-line segments 12–14 as shown in FIG. 2 and modifying the count during a second digitizing cycle by count modifiers corresponding to a particular linear segment identified during the first digitizing cycle, the proportional count produced by the ADC 20 and accumulated in the register 22 at the end of the second digitizing cycle may be utilized to indicate the desired engineering units of temperature on the curve 11.

Thus during the sampling period of the first digitizing cycle, the analog input voltage $V_{in}$ is applied to the ADC 20. A series of gated clock pulses are generated by the ADC 20 and enter the register 22 to accumulate a count therein. When a full-scale count has been accumulated in the register 22, the measuring period begins and a signal indicating the full-scale count is applied to the sequence control 24 and applies the reference voltage $V_{ref}$ to the ADC 20 and a series of gated clock pulses therefrom accumulates a count in the register 22 to precisely identify the instantaneous millivolt value of the input and to precisely identify the linear segment associated with that value. For the case of point $P_{13}$, the accumulated count in the register would identify some point on the curve 11 above the breakpoint $B_2$ and below the breakpoint $B_3$ thus completely identifying the linear segment 13.

While the count in the register 22 was accumulating during the measuring period of the identification cycle, a run-up latch signal from the sequence control 24 is applied to the register 22. As a consequence, a signal indicative of the accumulating count in the register 22 was applied to a breakpoint identifier and decoder 26 having stored breakpoint information for the curve 11. When the measuring period of the identification cycle is completed, the breakpoint identifier 26 which serves as a breakpoint identification circuit will have identified the last breakpoint which was passed as the count was accumulating and a signal so indicating will be applied to a count modifier identifier and BCD (binary coded decimal) encoder circuit 28 for the proper selection and encoding of stored slope and intercept count modifiers $\phi_1$ and $\phi_2$ to be inserted into the register 22 which correspond to the linear segment between the identified breakpoint and the next breakpoint. In the case of point $P_{13}$, the count modifiers $\phi_1$ and $\phi_2$ encoded at the BCD encoder 28 or count modifier circuit correspond to the linear segment 13, more particularly, the count modifiers correspond to a slope count modifier $\phi_1$ of proper magnitude to satisfy the constant $N_{13}$ of Equation (5) and an intercept count modifier $\phi_2$ of proper magnitude to satisfy the constant $C_{13}$ of Equation (5). With the count modifiers completely selected, the register 22 may be cleared or reset by appropriate signals from the sequence control 24.

During the second digitizing cycle or readout cycle, the analog input voltage $V_{in}$ and the reference voltage $V_{ref}$ are again applied to the ADC during the sampling and measuring periods. Thus, the application of the analog input voltage $V_{in}$ to the ADC 20 produces a series of gated clock pulses which accumulate another full-scale count in the register 22 during the sampling period. However, this sampling period is modified in the sense that the first of the count modifiers from the count modifier identifier 28 is applied before, during, or at the end of the sampling period so as to modify the time in which a full-scale count will be accumulated in the register 22. This first count modifier is the slope count modifier $\phi_1$ corresponding to the slope of the segment 13 in the case of the point $P_{13}$ on the curve 11. The entry of the slope count modifier $\phi_1$ into the register 22 is under the control of enabling pulses from the sequence control 24.

When the full-scale count is reached terminating the sampling period of the readout cycle, a signal from the register 22 is received by the sequence control 24 which produces an enabling pulse. The enabling pulse is sent from the sequence control 24 to the count modifier identifier 28 which results in the entry of the second count modifier, the intercept count modifier $\phi_2$, into the register 22. The measuring period then begins automatically and without interruption after the full-scale count is reached while a signal from the sequence control applies $V_{ref}$ to the ADC 20. At the termination of the readout cycle, a display latch pulse is sent from the sequence control 24 to the register 22 for displaying the accumulated count. This count will actually equal the temperature in the desired engineering units, degrees C. or F., of a point on the curve 11 corresponding to an instantaneous input voltage to a very close approximation. Thus the system, by properly digitally identifying a linear segment associated with a point on the curve 11 will produce a digitally modified output in terms of temperature which is a nonlinear function of an analog input voltage by operating in a basically linear mode in accordance with one of the Equations 4–6. The breakpoint identifier 26 may now be reset by a pulse from the sequence control 24.

Figure 4:
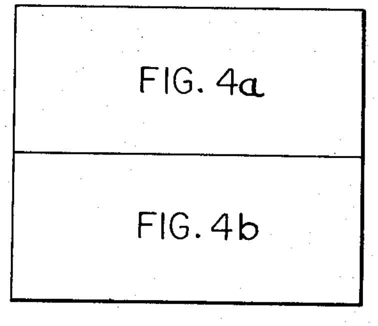
FIG. 4 illustrates the relationship of circuit diagrams 4*a* and 4*b* elaborating upon the block diagram of FIG. 3.
Figure 4A:
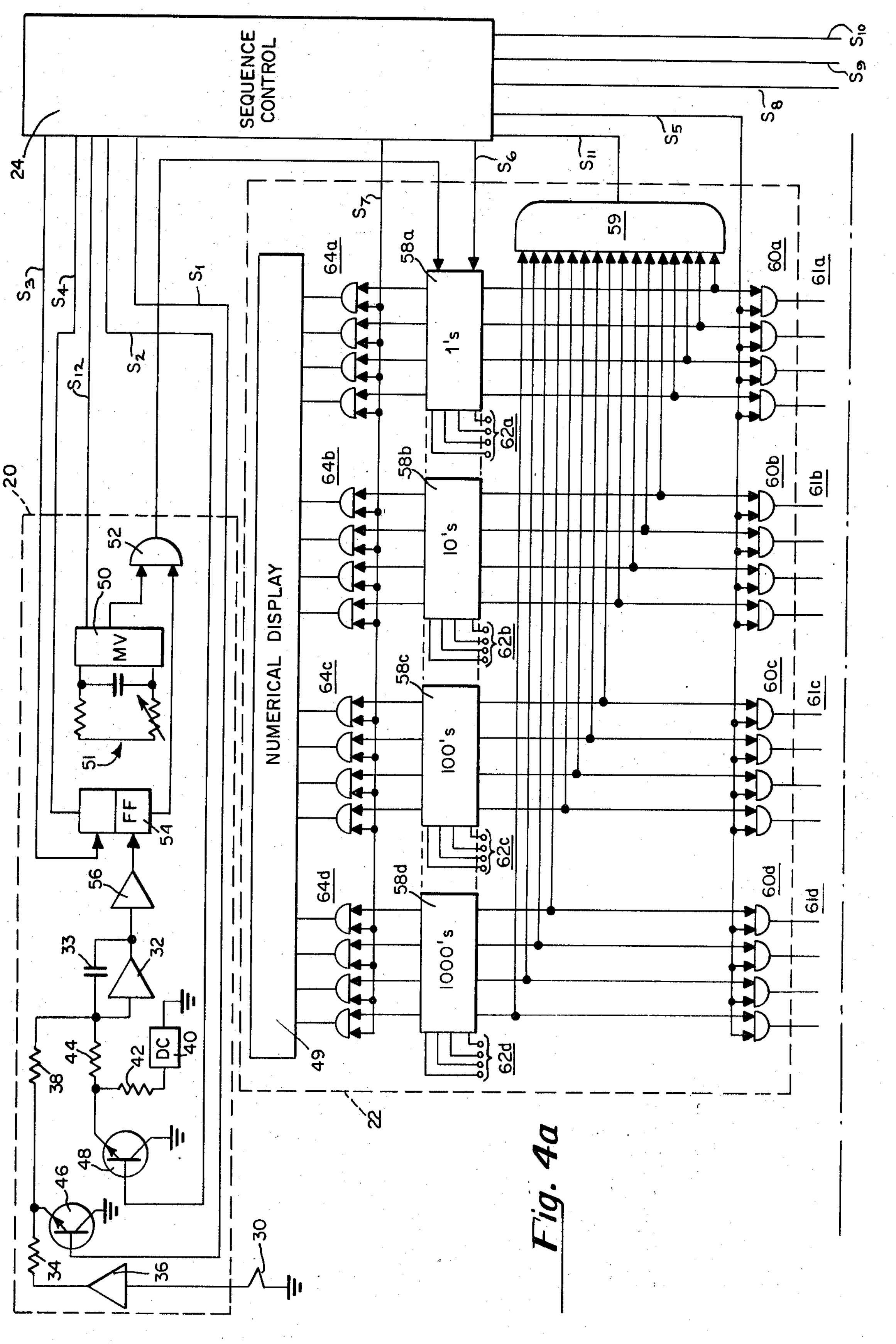
Figure 4B:
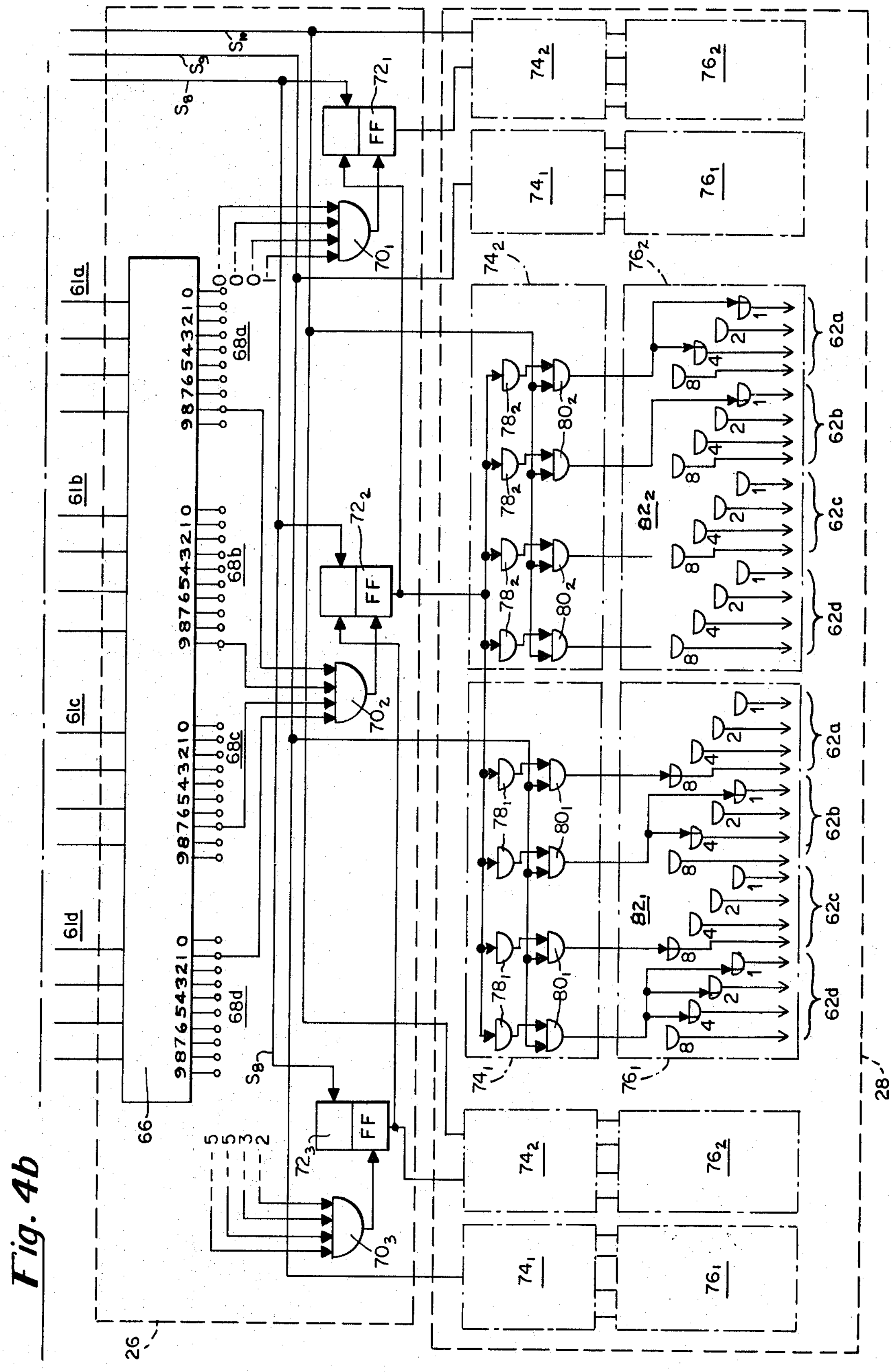

In order to more fully explain the function and operation of the various blocks in the block diagram of FIG. 3, reference is now made to the circuit diagrams of FIGS. 4*a* and 4*b*. In the interest of consistency and clarity, the various blocks of FIG. 3 corresponding to the ADC 20, the register 22, the sequence control 24, the breakpoint identifier 26 and the count modifier identifier 28 have been indicated in FIG. 4.

Referring first to the ADC 20, it will be seen that the analog input voltage $V_{in}$ is generated by a thermocouple 30 and applied to an integrating amplifier 32 through an input amplifier 36 and resistors 34 and 38. Similarly, the reference voltage $V_{ref}$ generated by a reference voltage source 40 is applied to the integrating amplifier 32 through a first resistor 42 and a second resistor 44. In accordance with the dual slope mode of operation of the ADC 20, the analog input voltage $V_{in}$ is only applied to the integrating amplifier 32 during the sampling periods of the identification and readout cycles while the reference voltage $V_{ref}$ is only applied to the integrating amplifier 32 during the measuring periods of the identification and readout cycles. In order to provide this sequential application of the voltages $V_{in}$ and $V_{ref}$ to the amplifier 32, a pair of switching transistors 46 and 48 are provided which are switched between the conductive and nonconductive states in response to signals applied to the base terminals thereof on lines $S_1$ and $S_2$ when a full-scale or zero count is reached in the register 22.

During the sampling period of both the identification and readout cycles, the transistor 48 is conductive and the transistor 46 is nonconductive so as to permit application of the input voltage $V_{in}$ to the integrating amplifier 32 while the reference voltage $V_{ref}$ is shorted to ground through the first resistor 42 and the switching transistor 48. Also during the sampling period of both the identification and readout cycles, an integrating capacitor 33 associated with the integrating amplifier 32 is being charged to an ever-increasing voltage. Concurrently, a free-running multivibrator 50 which may comprise a conventional unijunction oscillator having an RC sample rate circuit 51 is generating a series of clock pulses gated by an AND gate 52. The AND gate 52 is enabled by a decision flip-flop 54 set by a signal from the sequence control 24 on a line $S_3$ in response to clock pulses entering the register through a line $S_{12}$. When the gated clock pulses from the AND gate 52 accumulate a full-scale count in the heretofore cleared register 22, the sampling periods of both the identification and readout cycles are terminated and the measuring periods of both the identification and readout cycles are commenced.

This termination of the sampling periods and commencement of the measuring periods is accomplished by the application of a full-scale count indicating signal from the register 22 to the sequence control 24 through a line $S_{11}$ and the sequence control 24 then switches the transistor 46 to the conductive state and the transistor 48 to the nonconductive state thereby shorting the analog input voltage $V_{in}$ to ground through the resistors 34 and applying the reference voltage $V_{ref}$ to the integrating amplifier 32. Since the state of the decision flip-flop 54 was not changed in the transition between the sampling period and the measuring period and remains set, the gated clock pulses continue to enter the register 22 and accumulate a count from zero after the register is automatically cleared by reaching the full-scale count during the sampling period. During the measuring periods of both the identification and readout cycles, the reference voltage $V_{ref}$ which is of a polarity opposite to the polarity of the analog input voltage $V_{in}$ and of a magnitude at least as great as the magnitude of the voltage $V_{in}$ continues to discharge the integrating capacitor 33 until the charge on the capacitor 33 reaches zero. At that time, a zero detecting amplifier 56 interposed between the decision flip-flop 54 and the integrating amplifier 32 will produce an output signal which resets the decision flip-flop 54 thereby disabling the AND gate 52 and signaling the end of the conversion to the sequence control 24 on the line $S_4$. The gated clock pulses will then cease to enter the register 22 and the count accumulated therein will be equal to the input voltage and be indicative of a particular linear segment on the curve 11 of the voltage-temperature function. At the end of the identification cycle, the accumulated count in the register 22 will identify a particular linear segment such as the segment 13 for the point $P_{13}$. At the end of the readout cycle, the accumulated count in the register 22 will actually represent a particular temperature in desired engineering units corresponding to the instantaneous value of the analog input voltage within acceptable error limits as determined by the linear segments.

Referring now to the register 22 for an explanation of the circuitry therein, four BCD registers 58 (*a–d*) are shown corresponding to units, tens, hundreds, and thousands digits respectively. During the identification and readout cycles, a full-scale count from each of the four BCD registers 58(*a–d*) is applied to a full-scale count indicating AND gate 59 having an output connected to the line $S_{11}$. The count of each of the BCD registers 58(*a–d*) is applied to four sets of AND gates 60(*a–d*, each set having four binary coded AND gates. During the entire measuring period of the identification cycle, the AND gates 60(*a–d*) are enabled by a run-up latching pulse from the sequence control 24 on a line $S_5$. Thus, as the segment identifying count accumulates in the digit registers 58(*a–d*), a running count in binary form is applied to the breakpoint identifier 26 over sets of lines 61(*a–d*).

At the conclusion of the identification cycle and after clearance of the digit registers 58(*a–d*) by a clearing pulse from the sequence control 24 on a line $S_6$, each of the digit registers 58(*a–d*) is now ready for entry of a binary encoded count modifier from the count modifier identifier 28 on parallel entry lines 62(a-d) associated with each of the digit registers 58(*a–d* respectively. Before the sampling period of the readout cycle begins, the first of the count modifiers, the slope count modifier $\phi_1$, is entered in the digit registers 58(*a–d*) via lines 62(*a–d*). At the beginning of the measuring period of the readout cycle, the second of the modifiers the intercept count modifier $\phi_2$is entered in the digit registers 52(*a–d*) via lines 62(*a–d*). At the conclusion of the measuring period of the readout cycle, the binary count accumulated in the digit registers 58(*a–d*) is read out to a numerical display 49 when an enabling pulse from the sequence control 24 is applied to four sets of AND gates 64($a$–$d$) on a line $S_7$, each set of AND gates 64($a$–$d$) having four binary coded AND gates. The digit registers 58($a$–$d$) may now be cleared by a pulse from the sequence control 24 on the line $S_6$.

In order to obtain the appropriate count modifiers for application to lines 62($a$–$d$), which of necessity must correspond to a particular linear segment such as the segment 13 for the point $P_{13}$, it is necessary to first identify that particular segment. This is accomplished in the breakpoint identifier 26 by a BCD-to-decimal decoder 66 including conventional combinations of the AND gates to convert the BCD encoded breakpoint identification information from the digit registers 58($a$–$d$ and the AND gates 60($a$–$d$) to decimal form at decimal output terminals 68($a$–$d$) corresponding to units, tens, hundreds, and thousands digits respectively. As the count accumulates during the measuring period of the identification cycle, the various numerical outputs associated with each of the decimal digit output terminals 68($a$–$d$) will be sequentially energized. The various numerical terminals of the decimal digit output terminals 68($a$–$d$) may be hard-wired in appropriate combinations to AND gates $\mathbf{70_1}$, $\mathbf{70_2}$, and $\mathbf{70_3}$ corresponding to stored breakpoints $B_1$, $B_2$, and $B_3$ respectively. Each of these AND gates $\mathbf{70_1}$, $\mathbf{70_2}$, and $\mathbf{70_3}$ in turn, upon being satisfied by the appropriate decoded count, set a flip-flop $\mathbf{72_1}$, $\mathbf{72_2}$, and $\mathbf{72_3}$ respectively. At the beginning of the measuring period of the segment identifying cycle, the AND gate $\mathbf{70_1}$ is enabled and the flip-flop $\mathbf{72_1}$ is set by a count corresponding to 0001 at the decimal digit output terminals 68($a$–$d$). As the count accumulates during the measuring period, the AND gate $\mathbf{70_2}$ will be enabled so as to set the flip-flop $\mathbf{72_2}$ which in turn resets the flip-flop $\mathbf{72_1}$ if and only if the breakpoint $B_2$ is reached as in the case of the point $P_{13}$ thereby identifying the segment 13. For the point $P_{13}$, the AND gate $\mathbf{70_3}$ will never be enabled so that the flip-flop $\mathbf{72_3}$ will not be set. It will be understood, however, that if the point under consideration is $P_{14}$, the AND gate $\mathbf{70_3}$ would be enabled and set the flip-flop $\mathbf{72_3}$ thereby resetting the flip-flop $\mathbf{72_2}$. At the conclusion of the measuring period, of the read out cycle the set flip-flop of the flip-flops $\mathbf{72_1}$-$\mathbf{72_3}$ will be reset by a pulse from the sequence control on a line $S_8$.

For purposes of illustration, a particular hard-wired configuration is disclosed corresponding to the segment identifying counts representing the breakpoints $B_1$, $B_2$, and $B_3$. It will be appreciated, that these segment identifying counts and thus the proper hard-wire configuration are readily determined from the basic dual slope analog-to-digital converter equation $$N_2=(V_{in}/V_{ref})\times N_1 \qquad (7)$$

where $V_{in}$ is the analog voltage input previously referred to, $V_{ref}$ is the reference voltage previously referred to, $N_1$ is a predetermined count such as a full-scale count in the register, and $N_2$ is the output count.

Assume now that the voltage-temperature function represented by the curve 11 is that of a Chromel-Alumel thermocouple with a reference junction at 0° F., the actual breakpoints $B_1$, $B_2$, $B_3$, and $B_4$ are as follows:

| Breakpoint | Temperature °F. | Input mv × 20 (gain of amplifier 36) |
|---|---|---|
| $B_1$ | 0 | 0 |
| $B_2$ | 400 | 179.8 |
| $B_3$ | 1200 | 553.2 |
| $B_4$ | 1600 | 737.6 |

By substituting the various breakpoint analog input voltages corresponding to the breakpoints $B_1$, $B_2$, and $B_3$ as identified above into Equation (7) as $V_{in}$, a voltage of 1,000 mv. as $V_{ref}$, and a full-scale count of 10,000 corresponding to a full register 22 as $N_1$, the various segment identifying identifying counts may be determined as follows:

$$N_{B_1}=(0/1000)\times 10,000=0,$$

$$N_{B_2}=(179.8/1,000)\times 10,000=1,798$$

$$N_{B_3}=(553.2/1,000)\times 10,000=5,532.$$

Referring again to the decimal digit output of the decoder 66, it will be seen that the hard-wiring configuration associated with the AND gate $\mathbf{70_1}$ is such that a decimal digit output or segment identifying count of the decoder 66 equal to the number 0001 will satisfy the AND gate $\mathbf{70_1}$. Similarly, the hard-wiring configuration associated with the AND gates $\mathbf{70_2}$ and $\mathbf{70_3}$ are such that the segment identifying count from the decoder 66 of 1,798 and 5,532 will satisfy the AND gates $\mathbf{70_2}$ and $\mathbf{70_3}$ respectively. At the conclusion of the measuring period of the identification cycle, the breakpoint identifier 26 will have identified the lower breakpoint associated with the segment identified. In the case of point $P_{13}$, the lower breakpoint of the segment 13, the breakpoint $B_2$ will have been identified by the corresponding count 1,798 and the flip-flop $\mathbf{72_2}$ associated therewith will have been set for an output to the count modifier identifier 28.

The circuitry of the count modifier identifier 28 for generating the slope and intercept count modifiers $\phi_1$ and $\phi_2$ includes a pair of selectors $\mathbf{74_1}$ and $\mathbf{74_2}$ and count modifier stored encoders $\mathbf{76_1}$ and $\mathbf{76_2}$ associated with each of the flip-flops $\mathbf{72_1}$, $\mathbf{72_2}$, and $\mathbf{72_3}$. Only the selectors $\mathbf{74_1}$ and $\mathbf{74_2}$ and the encoders $\mathbf{76_1}$ and $\mathbf{76_2}$ associated with the flip-flop $\mathbf{72_2}$ have been shown in detail.

The selectors $\mathbf{74_1}$ and $\mathbf{74_2}$ associated with each of the flip-flops $\mathbf{72_1}$, $\mathbf{72_2}$, and $\mathbf{72_3}$ each comprise four inverter gates $\mathbf{78_1}$ and $\mathbf{78_2}$ and four AND gates $\mathbf{80_1}$ and $\mathbf{80_2}$ which are enabled by pulses from the sequence control 24 on a line $S_9$ and $S_{10}$ respectively, one inverter and one AND gate being provided in each selector for each BCD digit. The BCD encoders $\mathbf{76_1}$ and $\mathbf{76_2}$ which are signal pattern generators comprising groups of OR gates $\mathbf{82_1}$ and groups of OR gates $\mathbf{82_2}$ generate binary encoded slope and intercept count modifiers $\phi_1$ and $\phi_2$ on the lines 62($a$–$d$) in response to an output pulse from the selectors $\mathbf{74_1}$ and $\mathbf{74_2}$. Each of the lines $a$–$d$ of the lines 62($a$–$d$) carries one BCD digit representation of one of the count modifiers. For example, the left hand most BCD digit provided on lines 62d is achieved by connecting the output of the left hand most AND gate $\mathbf{80_1}$ to the OR gates corresponding to the binary numbers 4, 2, and 1 providing a digit 7.

The value of the various count modifiers which are hard-wired at the inverters $\mathbf{82_1}$ and $\mathbf{82_2}$ may be determined by first solving Equation (4) as two simultaneous equations for the values of $N_{12}$ and $C_{12}$ and Equation (6) as two simultaneous equations for the values of $N_{14}$ and $C_{14}$. For example, the value of the constants $N_{13}$ and $C_{13}$ corresponding to the linear segment 13 and thus the point $P_{13}$ may be found by substituting the breakpoint value $B_2$ and $B_3$ as set forth in the foregoing breakpoint chart into Equation (4) and solving for the two unknowns $N_{13}$ and $C_{13}$ as follows:

$$400=(179.8/1,000)\times N_{13}+C_{13} \text{ and}$$

$$1,200=(553.2/1,000)\times N_{13}+C_{13}$$

$$N_{13}=2,142 \text{ and}$$

$$C_{13}=0015.$$

Similarly, $$0=(0/1000)\,N_{12}+C_{12}$$

$$400=(179.8/1,000)\,N_{12}+C_{12}$$

$$C_{12}=0$$

$$N_{12}=2,230$$

and $$1,200=(553.2/1,000)\,N_{14}+C_{14}$$

$$1,600=(737.6/1,000)\,N_{14}+C_{14}$$

$$C_{14}=0003$$

$$N_{14}=2,169$$

It will be recalled that the values of $N_{12}$, $N_{13}$, or $N_{14}$ must correspond to full-scale counts in the register 22. Consequently, the slope modifier $\phi_1$ hard-wired at the inverters $82_1$ and $82_2$, must be such that the register 22 reaches the full-scale count after the accumulation of a total number of gate clock pulses equal to $N_{12}$, $N_{13}$, or $N_{14}$. Thus, for the point $P_{12}$, the full-scale complement of $N_{12}$, 10,000 − 2,230 = 7,770, must be entered into the register 22 as the slope count modifier $\phi_1$. Similarly, for the points $P_{13}$ and $P_{14}$, the slope count modifier $\phi_1$ entered into the register 22 are 7,858 and 7,831.

When the values of $C_{12}$, $C_{13}$, or $C_{14}$ are positive, the actual values of $C_{12}$, $C_{13}$, or $C_{14}$ may be entered into the register. Thus the value 0, 0015, or 0003 for $C_{12}$, $C_{13}$, and $C_{14}$ will be entered into the register 22 as the intercept count modifiers $\phi_2$. However, where the values of $C_{12}$, $C_{13}$, or $C_{14}$ are negative, the full-scale complement must be entered into the register 22 as the intercept count modifiers $\phi_2$.

Figure 5:
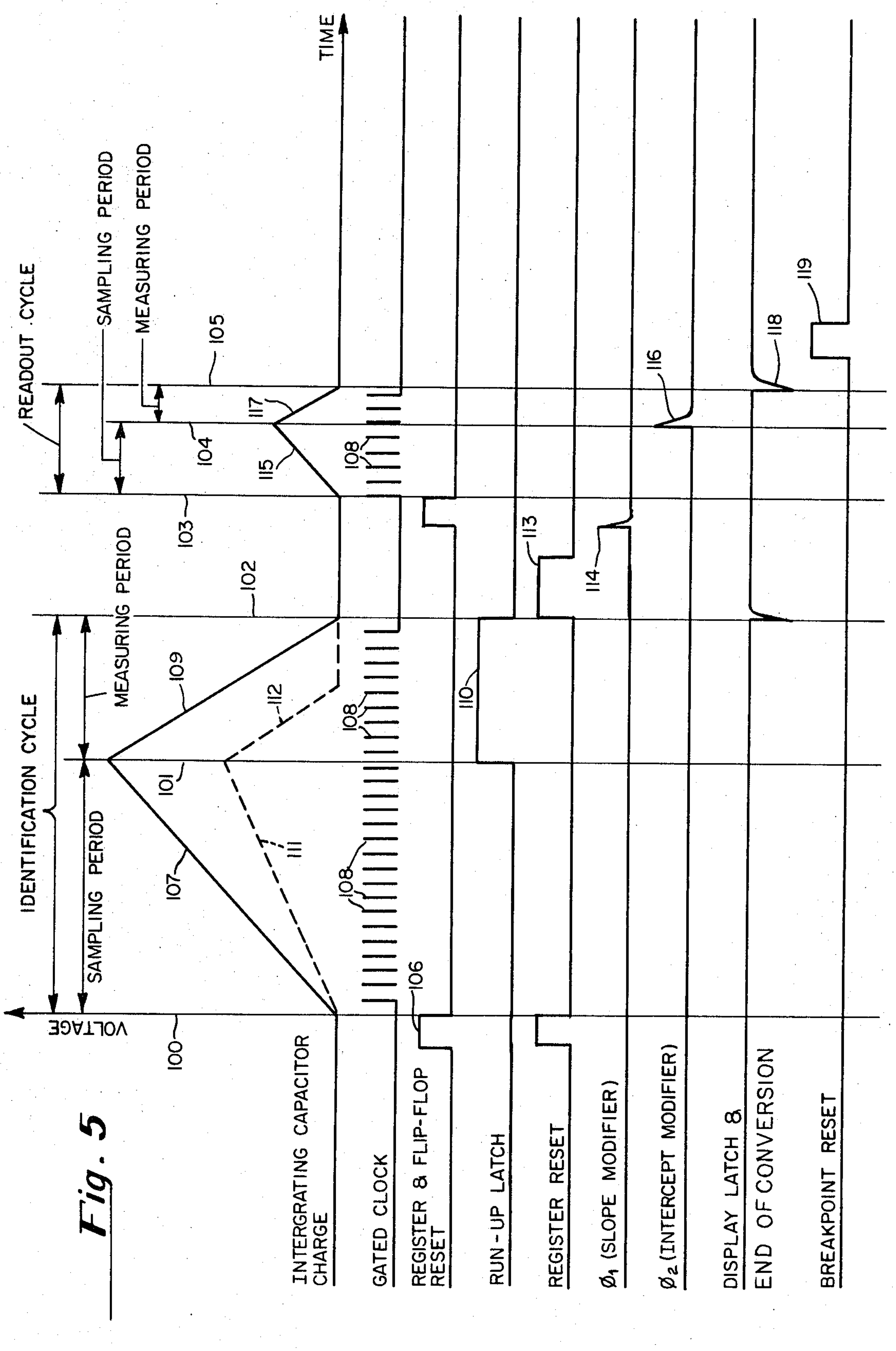
FIG. 5 is a timing diagram useful in explaining the operation of the block diagram of FIG. 3 and the circuit diagrams of FIGS. 4*a* and 4*b;*

Reference will now be made to the timing diagram of FIG. 5 so as to more fully relate the sequential operation of the various circuits shown in FIGS. 4*a* and 4*b*. The timing diagram is divided into identification and readout cycles having measuring and sampling periods by vertically extending lines 100–105. Just prior to commencement of the sampling period of the identification cycle indicated by the vertically extending line 100, a pulse 106 sets the flip-flop 54 and clears the register 22. At the beginning of the sampling period of the identification cycle, the integrating capacitor 33 associated with the integrating amplifier 32 begins to be charged by the analog input voltage $V_{in}$ at a rate and voltage indicated by a line 107 and gated clock pulses 108 having exaggerated periods begin to enter the register 22. When a full-scale count is accumulated in the register 22 as indicated by the vertical line 101, the sampling period of the identification cycle will end. With a four digit decimal register having a count capacity of 10,000 and a free-running multivibrator 54 having a frequency of 100 kHz., the duration of the sampling period will be 100 milliseconds. At the instant the sampling period ends, the reference voltage $V_{ref}$ which is of opposite polarity to the analog input voltage $V_{in}$ begins to discharge the capacitor 33 represented by a line 109. Simultaneously, the gated clock pulses 108 continue to enter the register 22 and another count which is the identification count begins to accumulate and that count is continuously read out to the breakpoint identifier 26 at gates 60(*a–d*) which are enabled by a run-up latching pulse 110. When the capacitor 33 has been completely discharged, the measuring period of the segment identifying cycle will end in response to zero detection by the amplifier 56.

It will be noted that the duration of the measuring period and the count in the register 22 is directly related to $V_{in}$ since the total charge on the capacitor 33 at the end of the sampling period determines the length of time necessary to discharge the capacitor 33 by a constant voltage $V_{in}$. This is illustrated by a charging line 111 characteristic of a smaller value of $V_{in}$ and a discharge line 112 which indicate a constant rate of discharge down, from a lesser voltage which results in a shorter measuring period. Once the identifying count in the register 22 has been received by the breakpoint identifier 26, the register may now be cleared by a register reset pulse 113 in preparation for the readout cycle.

In certain instances, hardware limitations may not permit the entry of the slope count modifier $\phi_1$ during the sampling period of the readout cycle itself. In those instances, it is desirable to enter the slope count modifier $\phi_1$ in the register 22 before the sampling period of the readout cycle begins. This may be accomplished by the slope count modifier enabling pulses 114 from the sequence control 24. At the beginning of the sampling period of the readout cycle indicated by the vertical line 103, the capacitor 33 will again begin to be charged by the voltage $V_{in}$ as indicated by line 115 and gated clock pulses 108 will enter the register 22. Although the capacitor 33 is charged until a full-scale count is reached in the register 17, it will be noted that the sampling period of the readout cycle is of a lesser duration than the sampling period of the identification cycle and hence the total charge on the capacitor 33 is less during the readout cycle than it is during the identification cycle. This is true since the full-scale count is reached in a shorter period of time due to the entry of the slope count modifier into the register 22 by the pulse 114. At the instant the sampling period of the readout cycle terminates and the measuring period of the readout cycle begins, an enabling pulse 116 is sent from the sequence control 24 on line $S_{10}$ to enter the intercept count modifier $\phi_2$ in the register 22. Simultaneously, the negative voltage of the reference voltage $V_{ref}$ is applied at the ADC 20 to discharge the capacitor 33 as illustrated by a line 117. When a zero charge on the capacitor 33 is detected by the amplifier 56, the measuring period of the readout cycle ends as indicated by a line 105 with the accumulated count in the register 22 indicating the actual temperature corresponding to the particular analog input voltage $V_{in}$. Thus for an instantaneous value of an analog input voltage $V_{in}$ corresponding to the point $P_{13}$, the actual accumulated count in the register 22 will equal the temperature in desired engineering units defined by the point $P_{13}$. This count is then read out to the numerical display 49 by an enabling pulse 118 and the breakpoint identifier 26 is reset by a pulse 119.

For the sake of simplicity, only four breakpoints have been shown on the curve 11. However, many more breakpoints may be utilized to more closely approximate the function. Furthermore, by the method of digital identification and digital modification disclosed in the foregoing, additional breakpoints are readily accommodated.

It will be appreciated that the previously described system may be utilized to read out something other than temperature. For example, it might be desirable to read out the square root of temperature. This may be accomplished by merely changing the count modifiers to correspond to segments of a new function, the voltage-square root of temperature function rather than the voltage temperature function. Of course, the new function would have different breakpoints as well as count modifiers so it would be necessary to reprogram the breakpoint identifier 26 as well as the count modifier identifier 28.

Figure 6:
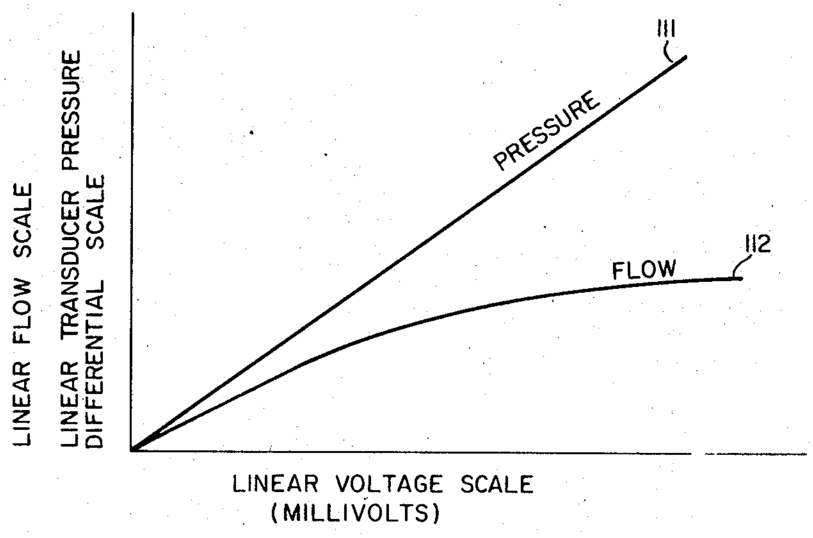
FIG. 6 is a plot of a linear pressure differential-voltage function and nonlinear flow-pressure function with pressure and flow plotted as separate ordinates and voltage plotted as common abscissae.

In this connection, reference is now made to FIG. 6 wherein a curve 111 represents a linear function relating the pressure differential of a fluidic orifice meter and a voltage generated by the fluidic orifice meter. A curve 112 represents a nonlinear function relating fluid flow and the voltage generated by the fluidic orifice meter. By applying the voltage generated by the fluidic orifice meter to the system and identifying the segment of the voltage pressure input function, appropriate count modifiers corresponding to the linear segment of the voltage-flow output function may be selected to generate a digital output corresponding to flow. Thus a digital output which is a variable of an output function may be generated from an input which is a variable of an input function where at least one of the functions is nonlinear.

It should be understood that the invention may be embodied in a system which does not employ a dual slope ADC volt-count converter. For example, an input variable such as temperature or flow may be converted directly into a digital signal such as a series of pulses having a variable pulse frequency non-linearly related to the analog input. Such a conversion may be accomplished by a digital transducer.

Figure 7:
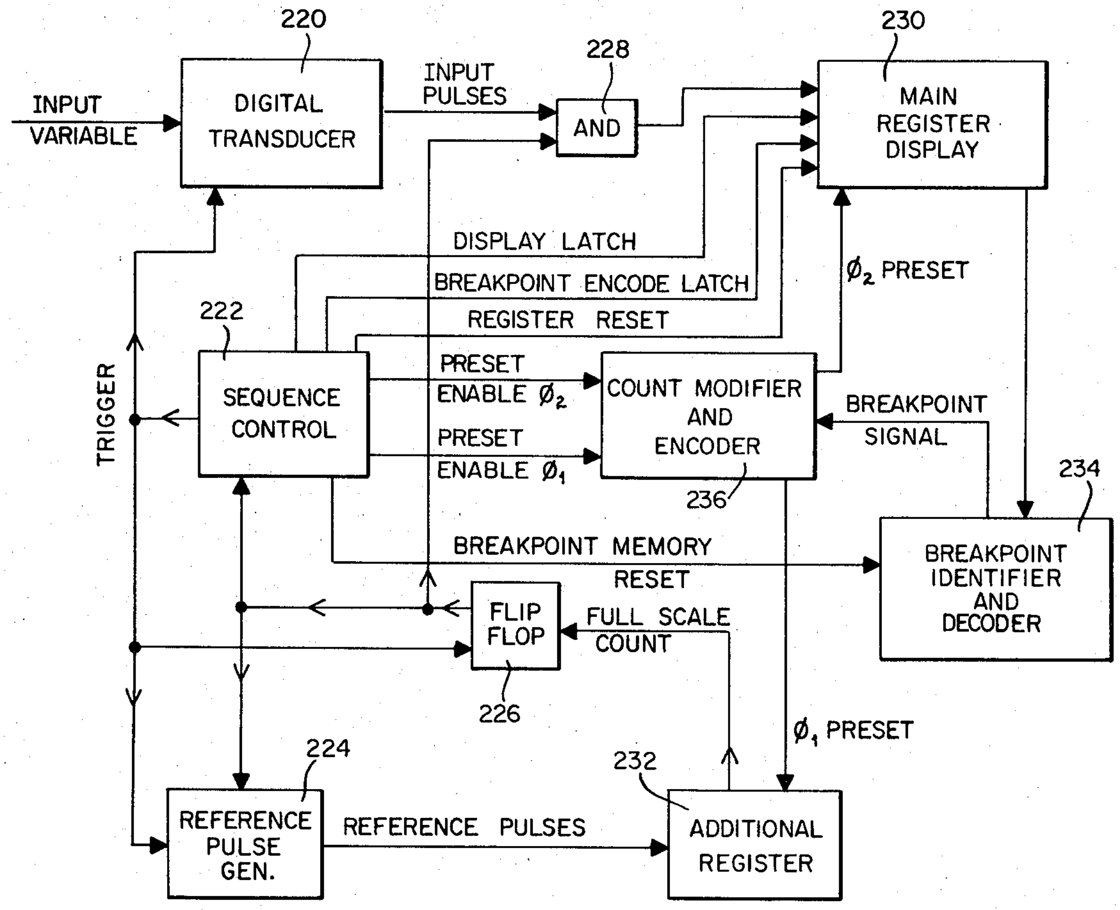
FIG. 7 is a block diagram illustrating a system embodying another form of the invention.
Figure 8:
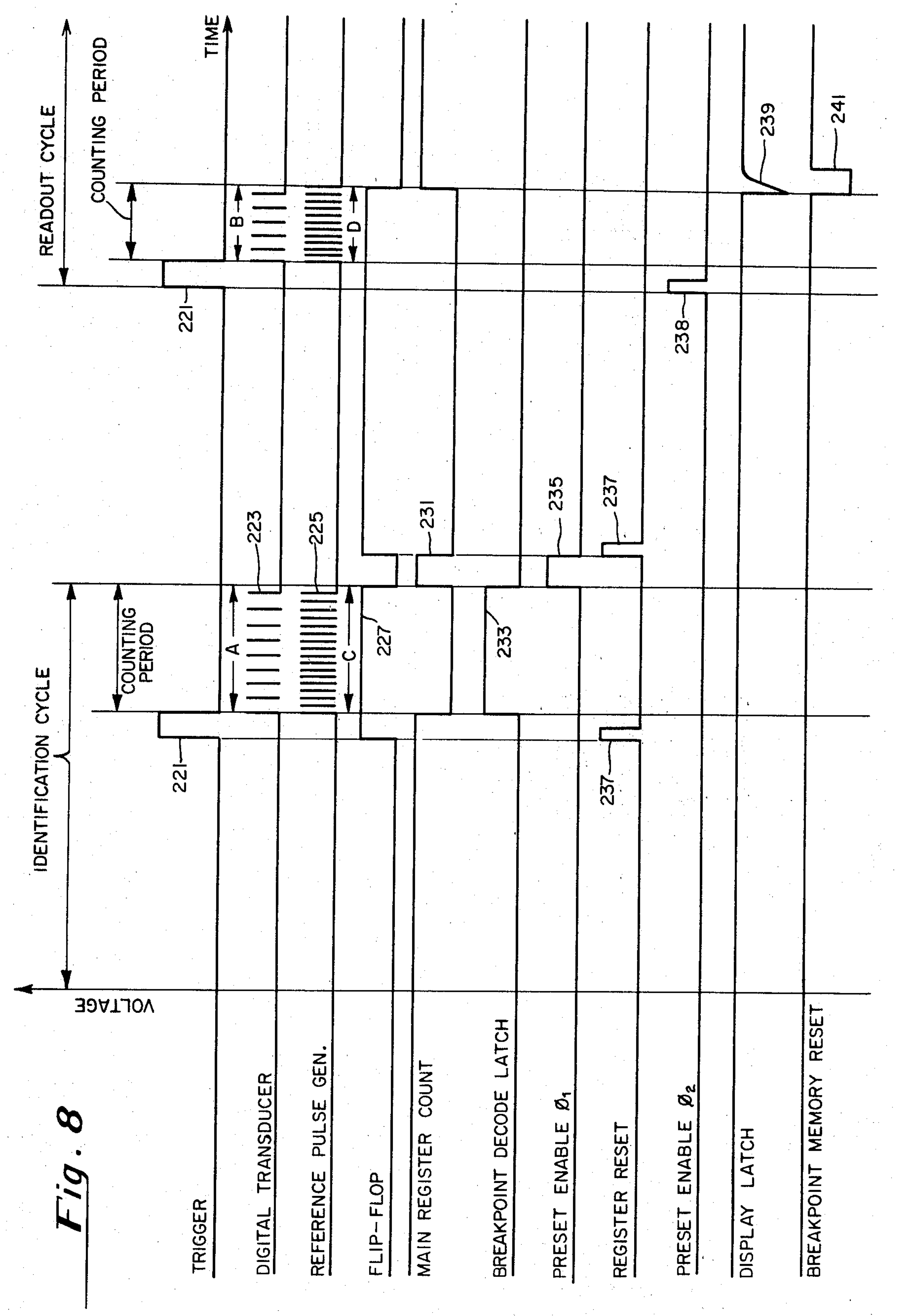
FIG. 8 is a timing diagram useful in explaining the operation of the block diagram of FIG. 7.

A system embodying the invention and including a digital transducer will now be described in detail with reference to FIGS. 7 and 8. The input variable in the form of temperature, flow, or another variable is applied to a digital transducer 220.

The identification or first digitizing cycle begins when a trigger pulse 221 from a sequence control 222 is applied to the digital transducer 220 to begin a pulse train of input pulses 223, is applied to a reference pulse generator 224 to begin a pulse train of reference pulses 225, and is applied to a flip-flop 226 for purposes of setting the flip-flop. When the flip-flop 226 is in the set state 227, an AND gate 228 is enabled to permit the input pulses to enter a first or main register 230 having a display capacity and the reference pulses to enter a second or additional register 232.

The count in both the main register 230 and the additional register 232 continue until a full-scale count has accumulated in the additional register 232. At this time, a full-scale count signal 231 is obtained from the additional register 232 which resets the flip-flop 226. The flip-flop 226 in turn disables the AND gate 228 to stop the flow of input pulses to the main register 230 and end the identification cycle. The flip-flop also disables the reference pulse generator 224 to stop the flow of reference pulses to the additional register 232.

Throughout the counting period and during the identification cycle in which the input pulses are entering the main register 230 and the reference pulses are entering the additional register 232, a breakpoint decode latch signal 233 is applied to the main register 230 from the sequence control 222 to permit the application of a breakpoint identification signal to a breakpoint identifier and decoder 234 in response to the count in the main register 230. The breakpoint identifier 234 decodes the BCD encoded representation of the count in the main register 230 to obtain a breakpoint identification signal represented as a decimal count for application to a count modifier identifier and BCD encoder 236.

After the full-scale count has been accumulated in the additional register 232, a preset enabling pulse 235 is applied to the count modifier identifier 236 from the sequence control 222 to permit entry of a slope count modifier $\phi_1$ into the additional register 232. The first register 230 may now be cleared with a register reset pulse 237 from the sequence control 222. A similar reset pulse 237 cleared the register 230 when the trigger pulse 221 began the identification cycle.

A second digitizing cycle or readout cycle begins when another trigger pulse 221 from the sequence control 222 is again applied to the digital transducer 220, the reference pulse generator 224, and the flip-flop 226. Simultaneously, an intercept count modifier $\phi_2$ is entered in the main register 230 in response to a preset enabling pulse 238 from the sequence control 222 to the count modifier identifier 236. The count of input pulses through the AND gate 228, now enabled by flip-flop 226, and into the register 230 and the count of reference pulses into the additional register 232 continues through a counting period until a full-scale count is reached in the second register 232. When a full-scale count is reached in the additional register 232, the signal so indicating is applied to the flip-flop 226 to reset the flip-flop and stop the flow of input pulses 223 into the first register 230. The resetting of the flip-flop also disables the reference pulse generator to stop the flow of reference pulses 225 into the second register 232. At this time, the accumulated count of input pulses in the main register 230 represents the digital input in the desired engineering units. Accordingly, a display latch signal 239 is applied to the first register 230 from the sequence control 222 so as to permit the reading out of the accumulated count. Simultaneously, the memory of the breakpoint identifier 234 may be reset by a breakpoint memory reset pulse 241 from the sequence control 222.

Although specific circuitry is not shown, it will be understood that the breakpoint identifier 234 may comprise circuitry substantially identical to the circuitry of the breakpoint identifier 26 shown in FIG. 4*b*. Similarly, the circuitry of the count modifier identifier 236 may comprise circuitry substantially identical to circuitry of count modifier identifier 28 also shown in FIG. 4*b*.

It will also be understood that the breakpoint identifiers 26 and 234 and count modifiers 28 and 236 need not provide a decoding and encoding function if a purely binary system is utilized. However, in many instances the decoding and encoding between binary and decimal forms will be desirable in order to reduce the circuitry necessary to reduce errors and ambiguities in the breakpoint and count modifier identification functions.

As an alternative method of avoiding errors and ambiguities, the count of the register means may be read into the breakpoint identifiers 26 and 234 only at the end of the identification cycle rather than continuously throughout the identification cycle.

It will also be understood that various changes may be made in the circuitry including the count modifier selectors $74_1$ and $74_2$ and the count modifier encoders $76_1$ and $76_2$. Of course, the stored information in both the breakpoint identifier 26 and the count modifier identifier 28 will change depending upon the input-output function under consideration.

The invention is not limited to the specific system disclosed and comprehends modifications and equivalents within the scope of the appended claims.

What is claimed is:

1. A system for producing a digital output as a function of an input variable comprising:

register means accumulating digital counts at a substantially constant rate during an identification cycle and a readout cycle;

means responsive to a digital count accumulated during said identification cycle for selecting two count modifiers from a plurality of different count modifiers to be entered into said register means; and means operable before, during, or after said readout cycle for entering said two count modifiers in said register means such that the digital count accumulated during said readout cycle is the digital output and the desired function of the input variable.

2. The system of claim 1 wherein said register means comprises a single register for accumulating said digital counts and said means operable before, during, or after said readout cycle enters said two count modifiers in said single register.

3. The system of claim 1 wherein said register means comprises two registers for accumulating said digital counts, said means operable before, during, or after said readout cycle entering one of said count modifiers in one of said two registers and the other of said count modifiers in the other of said two registers.

4. A system of the type including a dual slope analog-to-digital converter having two digital counting periods in each digitizing cycle for producing a digital output as a function of an analog input, the improvement comprising:

register means accumulating digital counts during each of two digitizing cycles;

means responsive to the digital count at the end of the first of said digitizing cycles for selecting at least one count modifier from a plurality of different count modifiers;

means operable after said at least one count modifier has been identified for clearing said register means; and means operable before the end of the second of said digitizing cycles for entering said at least one count modifier in said register means such that the digital count accumulated at the end of the second of said digitizing cycles is the digital output.

5. The system of claim 4 wherein;

said means responsive to said digital count at the end of said first of said digitizing cycles selects a count modifier corresponding to the approximate slope of a linear segment approximating the function at an instantaneous value of the analog input and selects a second count modifier corresponding to the intercept of said segment; and said means operable before the end of the second of said digitizing cycles enters said slope count modifier in said register means before the end of the first of said two counting periods in the second of said two digitizing cycles and enters said intercept count modifier in said register means after the end of the first of said two counting periods in the second of said two digitizing cycles.

6. The system of claim 5 wherein said means operable before the end of the second of said digitizing cycles enters said slope count modifier in said register means before the beginning of the first of said two counting periods in the second of said two digitizing cycles and enters said intercept count modifier in said register means at the beginning of the second of said counting periods of the second of said digitizing cycles.

7. A system of the type including a digital transducer having a digital counting period in each digitizing cycle for producing a digital output as a function of an input variable, the improvement comprising:

first register means accumulating digital counts during each of two digitizing cycles;

second register means accumulating digital counts during each of said two digitizing cycles;

means responsive to a digital count accumulated in said second register means during the counting period of each of said digitizing cycles to terminate a digital count accumulating in said first register means during the counting period of each of said two digitizing cycles;

means responsive to the digital count accumulated in said first register means at the end of the counting period of the first of said two digitizing cycles for selecting one count modifier to be entered into said first register means and another count modifier to be entered into said second register means; and means operable before the end of the second of said two digitizing cycles for entering said one count modifier in said first register means and said other count modifier in said other register means such that the digital count accumulated in said first register means at the end of the counting period of the second of said two digitizing cycles is the digital output.

8. The system of claim 7 wherein said means responsive to said digital count at the end of the first of said two digitizing cycles selects said one count modifier corresponding to the approximate intercept of a linear segment approximating the function at an instantaneous value of the analog input and selects another count modifier to correspond to the approximate slope of said linear segment; and said means operable before the end of the second of said digitizing cycles enters said one count modifier in said first register means and said other count modifier in said second register means after the counting period of the first of said two digitizing cycles and before the counting period of the second of said two digitizing cycles.

9. A system for generating a digital count as an output which is a function of an input variable comprising:

register means for accumulating digital counts in response to the input during identification and readout cycles;

means for identifying at least one from a plurality of different count modifiers in response to the digital count accumulated during said identification cycle;

means for entering said at least one count modifier into said register means after said identification cycle and before said readout cycle; and means for reading out the digital count accumulated in said register means during said readout cycle as modified by said at least one count modifier.

10. A system for generating a digital output which is a function of an analog input after two digitizing cycles comprising:

a dual slope analog-to-digital converter generating gated clock pulses during first and second counting periods in each of said two digitizing cycles;

register means for counting said pulses generated by said dual slope analog-to-digital converter during said first and second counting periods in each of said first and second digitizing cycles;

means for identifying first and second count modifiers in response to the count in said register means at the end of said first digitizing cycle;

means for clearing said register means after said first digitizing cycle;

means for entering said first count modifier into said register means so as to affect the count accumulated during said first counting period of said second digitizing cycle; and means for entering said second count modifier into said register so as to affect the count accumulated during said second counting period of said second digitizing cycle to obtain the digital output.

11. The system of claim 10 wherein said means for identifying said first and second count modifiers comprises:

a decoder for decoding a binary coded decimal representation of the count of said register means into a decimal representation;

means for selecting said first and second count modifiers in response to the decoded decimal representation of the count; and an encoder for encoding the selected first and second count modifiers into a binary coded decimal representation before entry into said register means.

12. A system for generating a digital output which is a function of an input variable after two digitizing cycles comprising:

a digital transducer for generating variable frequency input pulses during said identification and readout cycles in response to said input variable;

a main register means for counting said input pulses during said identification and readout cycles;

a pulse generating means for generating fixed frequency reference pulses during said identification and readout cycles with the generation of said input pulses;

an additional register means for counting said input pulses during said identification and readout cycles;

means for identifying first and second count modifiers in response to the accumulated count in said main register means when the count in said additional register means reaches a predetermined number during said identification cycle;

means for entering said first count modifier into said additional register means and entering said second count modifier into said main register means; and means for reading out the count accumulated within said main register means as modified by said second count modifier when the count accumulated in said additional register means as modified by said first count modifier reaches the predetermined number during said readout cycle.

13. The system of claim 12 wherein said means for identifying said first and second count modifiers comprises:

a decoder for decoding a binary coded decimal representation of the count of said register means into a decimal representation;

means for selecting said first and second count modifiers in response to the decoded decimal representation of the count; and an encoder for encoding the selected first and second count modifiers into a binary coded decimal representation before entry into said register means.

14. A method of generating a digital output as a nonlinear function of an analog input wherein the nonlinear function may be approximated by a plurality of linear segments between breakpoints on the nonlinear function and the linear segments have characteristic slopes and intercepts, the method comprising:

accumulating a count at a substantially constant rate during a digital identification cycle for locating the analog input on said nonlinear function and identifying a particular one of the plurality of linear segments approximating said nonlinear function in the vicinity of said analog input;

generating a first digital count modifier corresponding with the slope of said particular linear segment;

generating a second digital count modifier corresponding to the intercept of said particular linear segment;

accumulating a count at said substantially constant rate during a digital readout cycle; and modifying the length of said readout cycle with said first digital count modifier and modifying the accumulated count during said readout cycle with said second digital count modifier so as to obtain an accumulated count at the end of said readout cycle representing the digital output.

15. A linearizing system for generating a digital output which is a nonlinear function of an analog input and may be approximated by a plurality of linear segments between breakpoints on the nonlinear function, each of the linear segments having characteristic slopes and intercepts, the system comprising:

a means for producing a plurality of gated clock pulses from an analog input during a first digitizing cycle and a second digitizing cycle;

a register means for accumulating a count of gated clock pulses during the first digitizing cycle and the second digitizing cycle, the accumulated count of the first digitizing cycle identifying a breakpoint and the accumulated count at the end of the second digitizing cycle representing the digital output;

a breakpoint circuit for identifying the break-point in response to the breakpoint identifying count in said register at the end of said first digitizing cycle; and a count modifier circuit for generating various count modifiers corresponding to each of said breakpoints, said count modifier circuit selecting count modifiers corresponding to the particular breakpoint identified by said breakpoint circuit for digitally modifying the count accumulated in said register means before the end of said second digitizing cycle.

16. The linearizing system of claim 15 wherein said means for producing a plurality of gated clock pulses comprises an analog-to-digital converter.

17. The linearizing system of claim 15 wherein said means for producing a plurality of gated clock pulses comprises a digital transducer.

18. The linearizing system of claim 17 further comprising an additional register for accumulating a count of reference clock pulses during the first digitizing cycle and the second digitizing cycle, the accumulated count in said additional register gating clock pulses produced by said digital transducer; and said count modifier circuit for selecting and generating count modifiers responsive to the breakpoint identified by said breakpoint circuit selects and generates one count modifier for digitally modifying the count accumulating in said register and another count modifier for digitally modifying the count accumulated in said additional register during said second digitizing cycle.

* * * * *